(12) United States Patent
Morizuka

(10) Patent No.: US 8,735,949 B2
(45) Date of Patent: May 27, 2014

(54) JUNCTION TYPE FIELD EFFECT TRANSISTOR AND MANUFACTURING METHOD THEREOF

(75) Inventor: Kohei Morizuka, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,637

(22) Filed: Aug. 31, 2012

(65) Prior Publication Data

US 2013/0248944 A1 Sep. 26, 2013

(30) Foreign Application Priority Data

Mar. 23, 2012 (JP) ................................. 2012-067426

(51) Int. Cl.
*H01L 29/808* (2006.01)

(52) U.S. Cl.
USPC .................................. 257/256; 257/E29.313

(58) Field of Classification Search
None
See application file for complete search history.

(56) References Cited

U.S. PATENT DOCUMENTS

| 6,117,735 | A | 9/2000 | Ueno |
| 6,303,947 | B1 | 10/2001 | Ueno |
| 7,126,169 | B2 * | 10/2006 | Kitabatake .................... 257/192 |
| 2003/0034495 | A1 | 2/2003 | Casady et al. |
| 2004/0135178 | A1 | 7/2004 | Onose et al. |
| 2007/0241338 | A1 | 10/2007 | Yamamoto et al. |
| 2010/0013006 | A1 * | 1/2010 | Sugimoto et al. ............. 257/329 |

FOREIGN PATENT DOCUMENTS

| JP | 2000-228528 | 8/2000 |
| JP | 2004-335697 | 11/2004 |
| JP | 2006-080554 | 3/2006 |
| JP | 2009-277757 | 11/2009 |
| JP | 2010-093176 | 4/2010 |

OTHER PUBLICATIONS

Choi, Y.C., H.-Y. Cha, L.F. Eastman, and M.G. Spencer. "A New 4H-SiC Normally Off Lateral Channel Vertical JFET With Extremely Low Power Losses: Source Inserted Double-Gate Structure With a Supplementary Highly Doped Region." IEEE Transactions on Electron Devices 52.9 (2005): 1940-948.*
Sung, W.; Van Brunt, E.; Baliga, B. Jayant; Huang, A.Q., "A Comparative Study of Gate Structures for 9.4-kV 4H-SiC Normally on Vertical JFETs," Electron Devices, IEEE Transactions on , vol. 59, No. 9, pp. 2417,2423, Sep. 2012.*
Advances in Ion Implantation Modeling for Doping of Semiconductors, Silvaco downloaded from URL<http://www.silvaco.com/content/kbase/ion_implantation.pdf> on Aug. 22, 2013.*

(Continued)

*Primary Examiner* — Thomas L Dickey
*Assistant Examiner* — Joseph Schoenholtz
(74) *Attorney, Agent, or Firm* — Patterson & Sheridan, LLP

(57) ABSTRACT

According to one embodiment, a junction type field effect transistor includes a first conductive type semiconductor substrate, a first conductive type drift layer, a second conductive type gate region, a first conductive type channel layer, a first conductive type source region, a source electrode, a drain electrode, a second conductive type gate contact layer, and a gate electrode. The drift layer is provided on a first main surface of the semiconductor substrate. The gate region is provided on a surface of the drift layer. The channel layer is provided on the drift layer and the gate region. The source region is provided on a surface of the channel layer to face the gate region, and has an impurity concentration higher than the channel layer. The source electrode is provided on the channel layer with Schottky contact and on the source region with ohmic contact.

15 Claims, 11 Drawing Sheets

(56) References Cited

OTHER PUBLICATIONS

Lee, Sang-Sun, et. al., "Empirical Depth Profile Model for Ion Implantation in 4H-SiC", J. of Korean Physical Society, vol. 41, No. 5, pp. L591-L592 (2002).*

John W. Palmour, et al., "Pros and Cons for Silicon Carbide MOSFETs, JFETs and BJTs", Power Electronics Europe, Issue 5, Jul.-Aug. 2009, pp. 19-22.

* cited by examiner

JUNCTION TYPE FIELD EFFECT TRANSISTOR AND MANUFACTURING METHOD THEREOF

CROSS-REFERENCE TO RELATED APPLICATIONS

This application is based upon and claims the benefit of priority from the prior Japanese Patent Application No. 2012-067426, filed on Mar. 23, 2012; the entire contents of which are incorporated herein by reference.

FIELD

Embodiments described herein relate generally to a junction type field effect transistor and a manufacturing method thereof.

BACKGROUND

Silicon carbide (SiC) has a wider band gap and 10 times greater avalanche breakdown electric field strength than silicon (Si). Accordingly, a semiconductor apparatus applying SiC is expected to have a low resistance and a high breakdown voltage. An example of devices using SiC is a junction type field effect transistor. However, for example, in order to acquire a normally-off type device, a threshold voltage needs to be controlled with high precision, which should be more improved. Further, an inverter for driving an inductive load preferably has a built-in reverse-conducting diode.

BRIEF DESCRIPTION OF THE DRAWINGS

FIG. 11A is a cross sectional view taken along the line A-A, and FIG. 11B is a cross sectional view taken along the line B-B;

FIG. 12A is a cross sectional view taken along the line A-A, and FIG. 12B is a cross sectional view taken along the line B-B;

DETAILED DESCRIPTION

Figure 1:
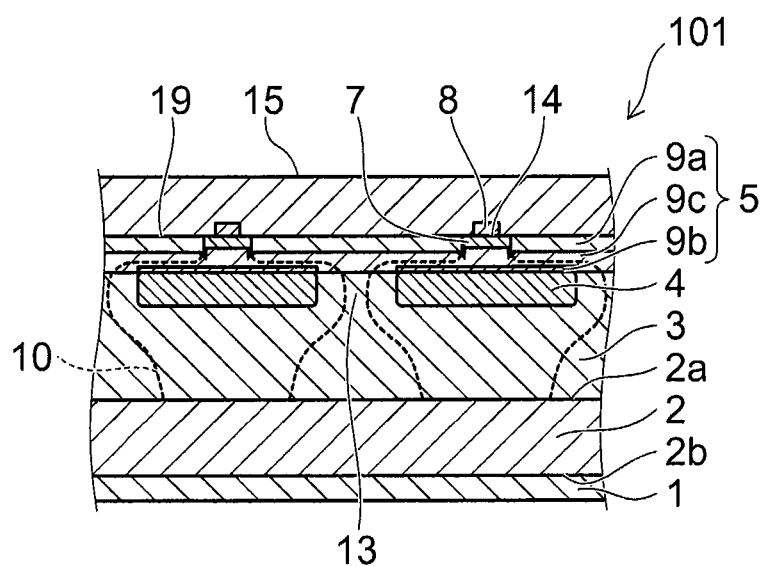
FIG. 1 is a cross sectional view illustrating a junction type field effect transistor of a first embodiment.

In general, according to one embodiment, a junction type field effect transistor includes a first conductive type semiconductor substrate, a first conductive type drift layer, a second conductive type gate region, a first conductive type channel layer, a first conductive type source region, a source electrode, a drain electrode, a second conductive type gate contact layer, and a gate electrode. The drift layer is provided on a first main surface of the semiconductor substrate. The gate region is provided on a surface of the drift layer. The channel layer is provided on the drift layer and the gate region. The source region is provided on a surface of the channel layer to face the gate region, and has an impurity concentration higher than the channel layer. The source electrode is provided on the channel layer and on the source region, and is in Schottky contact with the channel layer and in ohmic contact with the source region. The drain electrode is provided on a second main surface on an opposite side of the first main surface of the semiconductor substrate. The gate contact layer is provided on the surface of the channel layer to reach the gate region, and has an impurity concentration higher than the gate region. The gate electrode is provided on the gate contact layer.

Hereinafter, embodiments will be described in detail with reference to the accompanying drawings. The drawings are schematic or conceptual. A shape or relationship between width and length of each component and a size ratio between the components illustrated in the drawings are not necessarily the same as those of actual components. In addition, the same component may be represented as having different sizes and ratios depending on the drawings. Moreover, in the specification and respective drawings, the same element as described with reference to an above-mentioned drawing is given the same reference numeral and detailed descriptions related to the element will be appropriately omitted.

First, a first embodiment will be described.

FIG. 1 is a cross sectional view illustrating a junction type field effect transistor of the first embodiment.

Figure 2:
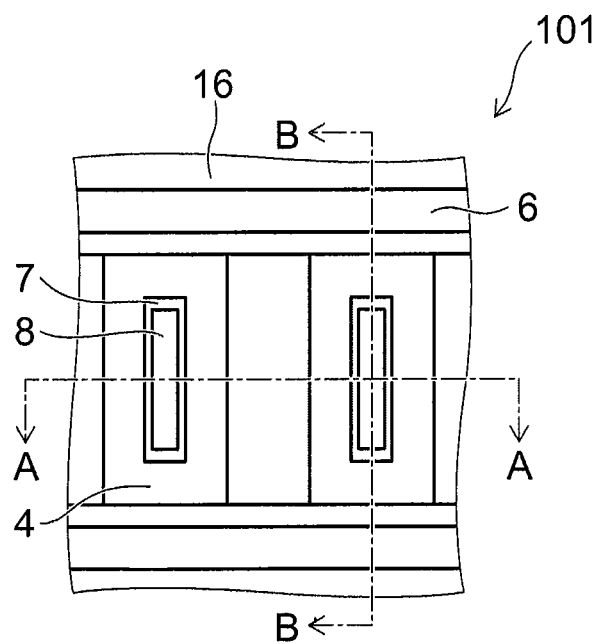
FIG. 2 is a plan view illustrating the junction type field effect transistor of the first embodiment.

FIG. 2 is a plan view illustrating the junction type field effect transistor of the first embodiment.

Figure 3:
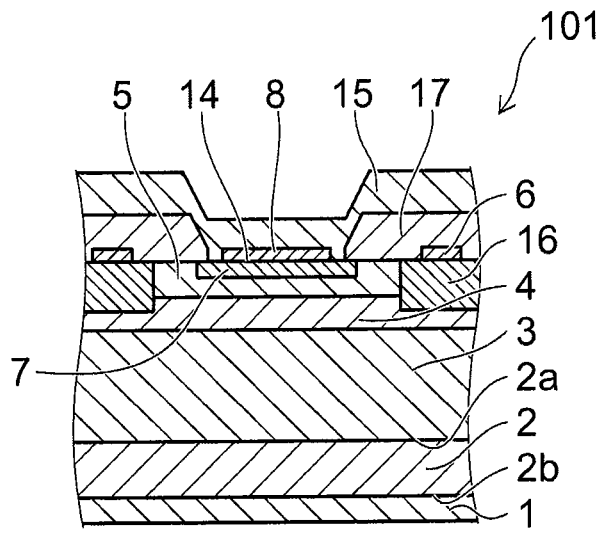
FIG. 3 is a cross sectional view illustrating the junction type field effect transistor of the first embodiment.

FIG. 3 is a cross sectional view illustrating the junction type field effect transistor of the first embodiment.

FIG. 1 is a cross sectional view taken along the line A-A of FIG. 2, and FIG. 3 is a cross sectional view taken along the line B-B of FIG. 2.

A junction type field effect transistor 101 includes a drain electrode 1, an n-type semiconductor substrate 2, an n-type drift layer 3, a p-type gate region 4, an n-type channel layer 5, a gate electrode 6, an n-type source region 7, a source contact layer 8, a source electrode 15, and a p-type gate contact layer 16.

For example, the n-type semiconductor substrate 2 may be formed of n-type silicon carbide (SiC). Further, for example, an n-type impurity may be nitrogen (N) or phosphorus (P). In addition, the n-type semiconductor substrate 2 may be a low resistance substrate having a relatively high impurity concentration, compared with the n-type drift layer 3.

For example, the n-type drift layer 3 may be formed of n-type SiC. The n-type drift layer 3 is provided on a first main surface 2a of the n-type semiconductor substrate 2 and has an impurity concentration lower than that of the n-type semiconductor substrate 2. The drain electrode 1 is provided on a second main surface 2b, which is on an opposite side of the first main surface 2a of the n-type semiconductor substrate 2. The n-type drift layer 3 is formed to have a predetermined impurity concentration and thickness, according to a drain-source breakdown voltage.

For example, the plurality of p-type gate regions 4 may be formed of p-type SiC. The plurality of p-type gate regions 4 is respectively provided on a surface of the n-type drift layer 3. That is, the plurality of p-type gate regions 4 is each a buried gate region, and a gap portion 13 of the n-type drift layer 3 is provided between the plurality of p-type gate regions 4 which is adjacent. The plurality of p-type gate regions 4 is respectively extended parallel with a first direction which is perpendicular to a normal line of the first main surface 2a and provided along a second direction which is perpendicular to the first direction and the normal line of the first main surface 2a. That is, the plurality of p-type gate regions 4 is provided in a stripe shape. Further, for example, a p-type impurity may be aluminum (Al).

FIGS. 1 to 3 illustrate a configuration where the two p-type gate regions 4 are provided considering a direction parallel with the B-B line of FIG. 2 as the first direction and a direction parallel with the A-A line of FIG. 2 as the second direction. However, any number of p-type gate regions 4 may be also provided. Furthermore, one p-type gate region 4 may be provided.

For example, the n-type channel layer 5 may be formed of n-type SiC. The n-type channel layer 5 is provided over the n-type drift layer 3 and the plurality of p-type gate regions 4. The n-type channel layer 5 has an impurity concentration higher than that of the n-type drift layer 3. Further, the n-type channel layer 5 is formed to have a predetermined impurity concentration and thickness, according to a threshold voltage, etc.

For example, the plurality of n-type source regions 7 may be formed of highly concentrated n-type SiC. The plurality of n-type source regions 7 is provided on a surface of the n-type channel layer 5 to face each of the plurality of p-type gate regions 4. The plurality of n-type source regions 7 has an impurity concentration higher than that of the n-type channel layer 5.

For example, the plurality of source contact layers 8 may be formed of metal, including nickel (Ni). The plurality of source contact layers 8 is provided on surfaces of the plurality of n-type source regions 7, respectively, and are in ohmic contact with the plurality of n-type source regions 7 in a plurality of ohmic contact portions 14.

For example, the source electrode 15 may be a stacked film including titanium (Ti) and aluminum (Al). The source electrode 15 is provided on the n-type channel layer 5, the plurality of n-type source regions 7, and the plurality of source contact layers 8. The source electrode 15 is in Schottky contact with the n-type channel layer 5 in a Schottky contact portion 19. Further, the source electrode 15 is in ohmic contact with the plurality of n-type source regions 7 through the plurality of source contact layers 8 in the ohmic contact portions 14. In addition, the source electrode 15 is also provided on the gate electrode 6 and the gate contact layer 16 through an insulating film 17.

For example, the p-type gate contact layer 16 may be formed of highly concentrated p-type SiC. The p-type gate contact layer 16 is provided on the surface of the n-type channel layer 5 to reach each of the plurality of p-type gate regions 4. The p-type gate contact layer 16 has an impurity concentration higher than that of the p-type gate region 4.

Further, FIGS. 1 to 3 illustrate a configuration where the two p-type gate contact layers 16 are provided to be extended in the second direction (which is parallel with the A-A line of FIG. 2) respectively. However, any number of the p-type gate contact layers 16 may be provided according to the number of the p-type gate regions 4. In addition, one p-type gate contact layer 16 may be also provided.

The gate electrode 6 is provided on the p-type gate contact layer 16. The gate electrode 6 is in ohmic contact with each of the plurality of p-type gate regions 4 through the plurality of p-type gate contact layers 16.

The junction type field effect transistor 101 may be configured to have a predetermined current capacity by providing a plurality of cells in the first direction (which is parallel with the B-B line of FIG. 2) or the second direction (which is parallel with the A-A line of the FIG. 2), each of which is the configuration illustrated in FIGS. 1 to 3. Alternatively, the junction type field effect transistor 101 may have the plurality of cells provided in a matrix form in the first and second directions.

Hereinafter, the operation and effect of a first embodiment will be described.

As shown in FIG. 1, in the junction type field effect transistor 101, a channel portion 9c being formed on the n-type channel layer 5 is disposed between a depletion layer 9a, which is extended from a Schottky contact portion 19 formed between the source electrode 15 and the n-type channel layer 5, and a depletion layer 9b, which is extended from the plurality of p-type gate regions 4. Accordingly, a width of the depletion layer 9b may be changed and a current flowing to the channel portion may be controlled, for example, to be switched ON or OFF, by a gate-source voltage between the gate electrode 6 and the source electrode 15.

For example, if the current is switched ON, a current path 10 is formed between the source electrode 15 and the drain electrode 1 through the channel portion.

Further, the current path may be formed to have the impurity concentration of the p-type gate region 4 and the impurity concentration and thickness of the n-type channel layer 5, according to a desired threshold voltage. For example, the configuration in which, if the gate-source voltage is zero, the depletion layer 9a comes in contact with the depletion layer 9b to block the channel portion 9c, that is, a normally-off type device may be formed whose threshold voltage has a positive polarity.

Figure 4:
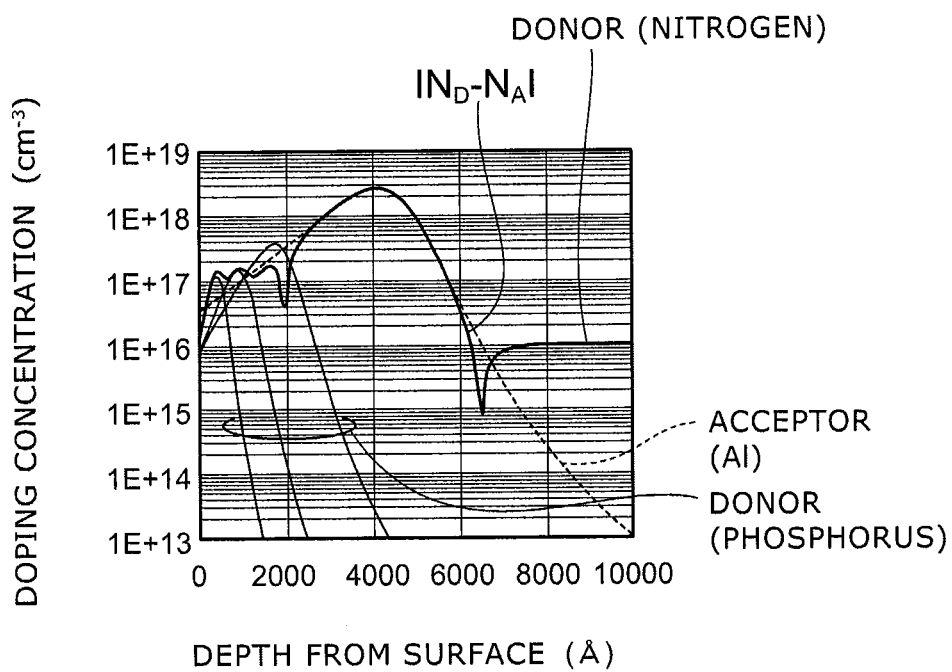
FIG. 4 is a characteristic diagram illustrating an impurity profile of a junction type field effect transistor.

FIG. 4 is a characteristic diagram illustrating an impurity profile of a junction type field effect transistor.

In FIG. 4, a horizontal axis indicates a depth from the surface of the n-type channel layer 5, and a perpendicular axis indicates a doping concentration $|N_D\text{-}N_A|$.

In the specific example, the n-type drift layer 3 is doped with an impurity concentration of $1\times10^{16}$ cm$^{-3}$ and formed to have a thickness of 12 μm. The n-type channel layer 5 is doped with an impurity concentration of $2\times10^{17}$ cm$^{-3}$ and formed to have a thickness of 200 nm. The p-type gate region 4 is doped with the impurity concentration higher than the impurity concentration of the n-type drift layer 3. Further, the junction type field effect transistor of the specific example is designed to have a drain-source breakdown voltage of 1.2 kV. An example of a method of manufacturing the junction type field effect transistor will be described below with reference to FIGS. 9 to 12.

Figure 5:
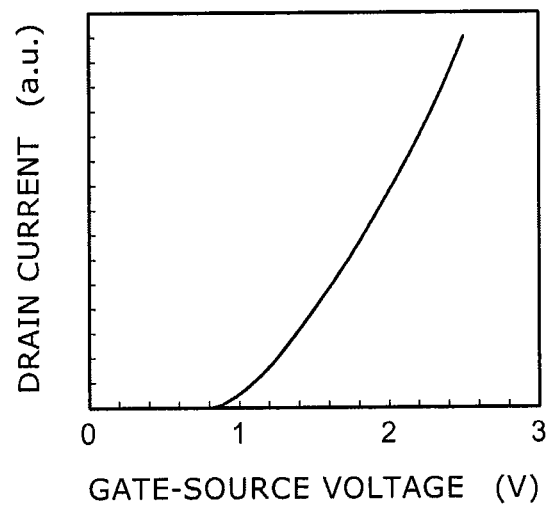
FIG. 5 is a characteristic diagram illustrating input-output characteristics of a junction type field effect transistor.

FIG. 5 is a characteristic diagram illustrating input-output characteristics of a junction type field effect transistor.

As illustrated in FIG. 5, in the specific example, the threshold voltage is set to be +1 V, and a normally-off type operation is accomplished.

To form the normally-off type device, where the threshold voltage has a positive polarity, the threshold voltage needs to be controlled with high precision.

The threshold voltage sensitively depends on doping concentrations of the n-type channel layer 5 and the p-type gate region 4. In a design focused on the carrier profile of the specific example, in order to control the threshold voltage to be, for example, within ±0.1 V, the doping concentration needs to be controlled below ±1%. For example, the impurity concentration of the n-type drift layer 3 is determined by the epitaxial growth. However, a recent technique for the epitaxial growth should allow variations of appropriately ±5%.

In the specific example, the doping concentration (impurity concentration) of the channel layer 5 is set to be $2\times10^{17}$ cm$^{-3}$ and the doping concentration of the n-type drift layer 3 is set to be $1\times10^{16}$ cm$^{-3}$. Thus, variation in the doping concentration of the epitaxial growth falls within the range of ±0.25% with respect to the doping concentration of the n-type channel layer 5. Accordingly, degradation in controllability of the threshold voltage due to the variation in the doping concentration of the n-type drift layer 3 falls within the permissible range.

Like this, the configuration of the embodiment has excellent controllability of the threshold voltage, thereby securing a high yield rate of manufacturing superior goods.

Figure 6:
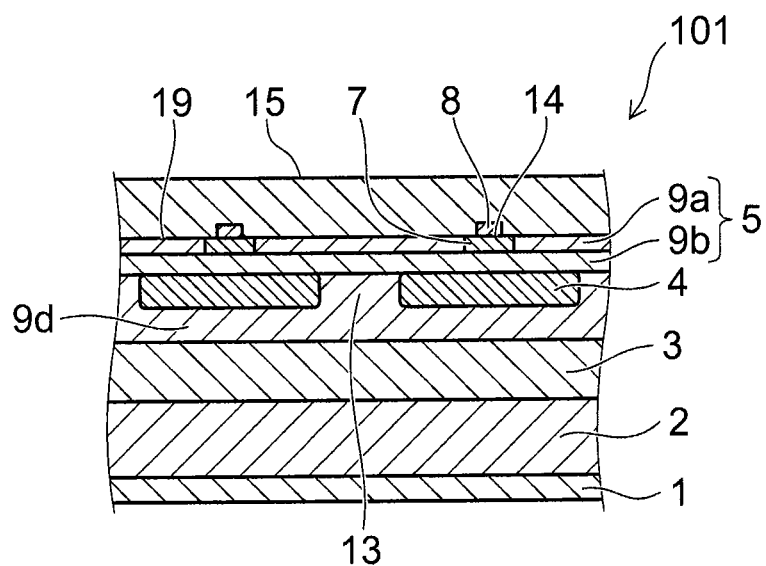
FIGS. 6 and 7 are schematic diagrams illustrating an operation of the junction type field effect transistor which is in an off state.
Figure 7:
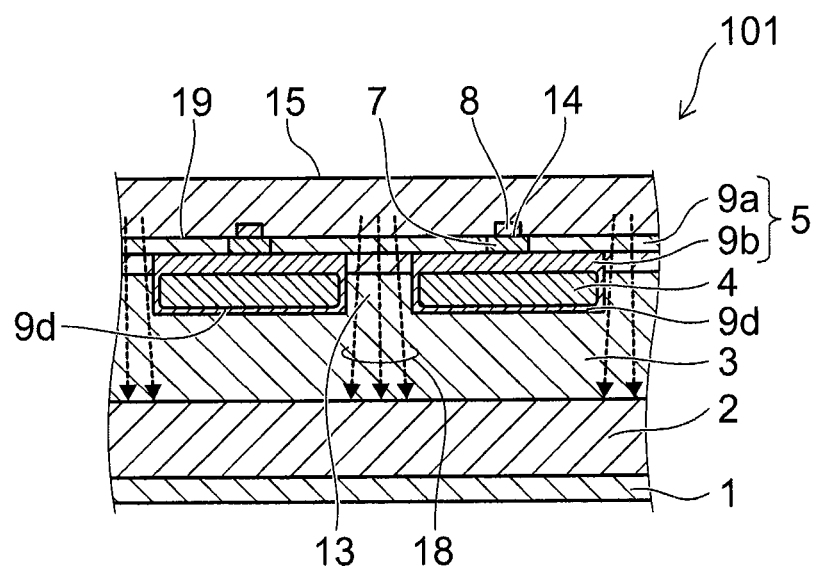

FIGS. 6 and 7 are schematic diagrams illustrating an operation of the junction type field effect transistor which is in an off state. FIGS. 6 and 7 illustrate operations when the drain-source voltage has positive polarity and negative polarity, respectively.

As illustrated in FIG. 6, when the gate-source voltage is set to be less than or equal to the threshold voltage to close the channel and the drain-source voltage is increased, a depletion layer 9d is extended from the p-type gate region 4 to the n-type drift layer 3. The gap portion 13 of the n-type drift layer 3 provided between the neighboring p-type gate regions 4 becomes filled with the depletion layer 9d. Thus, a high electric field is prevented from being applied to the n-type channel layer 5 and the Schottky contact portion 19 in the n-type drift layer 3, thereby securing an excellent blocking characteristic with a low reverse leakage current.

As illustrated in FIG. 7, when the channel is closed and the drain-source voltage is decreased, the width of the depletion layer 9d, which is extended from the p-type gate region 4 to the n-type drift layer 3, is decreased. In the gap portion 13 of the n-type drift layer 3 provided between the neighboring p-type gate regions 4, a current path of the n-type channel layer 5 and the n-type drift layer 3 is secured. Thus, the Schottky contact portion 19 is forwardly biased, and thus a source-drain current 18 flows therein. That is, reverse-conductivity is secured.

Further, a reverse conducting diode providing the reverse-conductivity is a Schottky diode and thus is operated at high speed without minority carrier storage such as p-n junction. In addition, unlike when the p-n junction is used as the reverse conducting diode, there is no increase in a defect due to minority carrier injection, thereby securing high reliability. Furthermore, there is no p-type semiconductor layer having high resistance, for example, the p-type gate region 4, the p-type SiC on a current path, thereby having low parasitic resistance and low loss.

Figure 8:
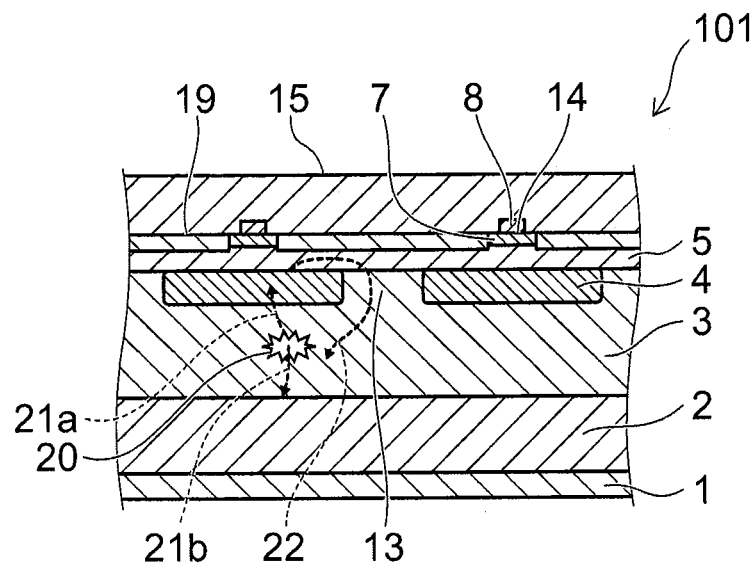
FIG. 8 is a schematic diagram illustrating an operation when the junction type field effect transistor goes into avalanche breakdown.

FIG. 8 is a schematic diagram illustrating an operation when the junction type field effect transistor goes into avalanche breakdown.

As illustrated in FIG. 8, when a high voltage is applied between the drain and the source and then the avalanche breakdown occurs between the drain and the source, a hole 21a which is generated in an avalanche region 20 of a drain depletion layer in the n-type drift layer 3 flows into the p-type gate region 4. As the result, a gate electric potential increases. When the gate electric potential increases above the threshold voltage, the channel in the n-type channel layer 5 is opened, an electron current 22 flows from the source electrode 15 to the drain electrode 1. That is, even in the avalanche breakdown state, the hole current barely contributes to the avalanche current, which is mostly caused by the electron current.

Accordingly, the channel portion 9c in the n-type channel layer 5 is opened and then the electron current is supplied before a parasitic bipolar transistor including the n-type source region 7, the p-type gate region 4, and the n-type drift layer 3 is switched on. Thus, unlike MOS transistors, current crowding due to the operation of the parasitic bipolar transistor does not occur and thus a high avalanche capacity may be secured.

Like this, the embodiment has a configuration in which the doping concentration and thickness of each of the n-type drift layer 3, the p-type gate region 4, and the n-type channel layer 5 may be formed by, for example, ion implantation, thereby forming devices with good controllability and uniformity, for example, normally-off type devices, at a high yield rate.

Further, in the embodiment, even when the gate-source voltage is set to close the current path of the channel, the Schottky contact portion 19 is between the drain and the source, thereby securing the reverse conductivity. Thus, there is no need to attach a flywheel diode for driving an inductive load, thereby establishing a system at low cost.

In addition, in the embodiment, there is no contribution of a charge carrier in a MOS interface and also no conduction by a minority charge carrier in a forwardly biased p-n junction. Thus, for example, even in SiC, high reliability may be secured.

Furthermore, in the embodiment, when a drain-source voltage increases until avalanche breakdown occurs, the gate electric potential increases to open the channel, thereby the electron current flows from the source to the drain. Thus, current crowding due to the operation of the parasitic bipolar transistor does not occur and thus a high avalanche capacity may be secured.

Hereinafter, an example of a method of manufacturing the junction type field effect transistor 101 will be described.

FIGS. 9 to 12 are cross sectional views illustrating the method of manufacturing the junction type field effect transistor.

Figure 11A:
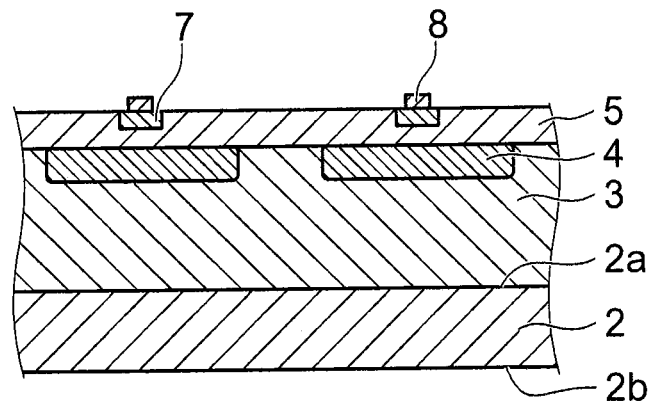
FIGS. 11A and 11B are cross sectional views illustrating the method of manufacturing the junction type field effect transistor.
Figure 11B:
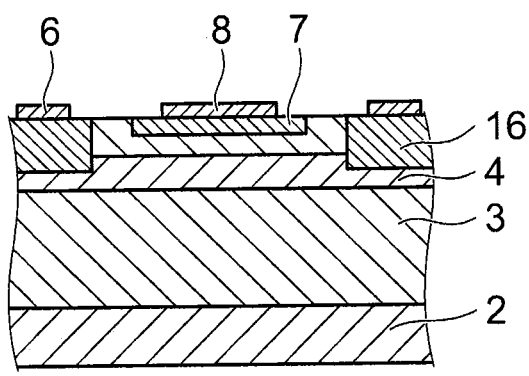
Figure 12A:
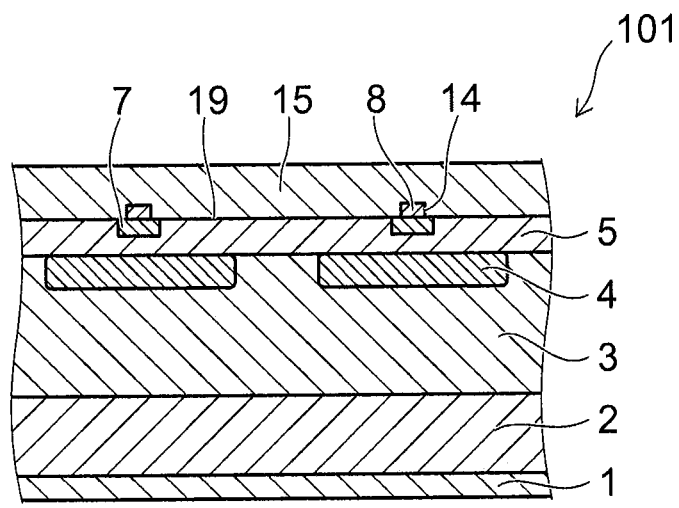
FIGS. 12A and 12B are cross sectional views illustrating the method of manufacturing the junction type field effect transistor.
Figure 12B:
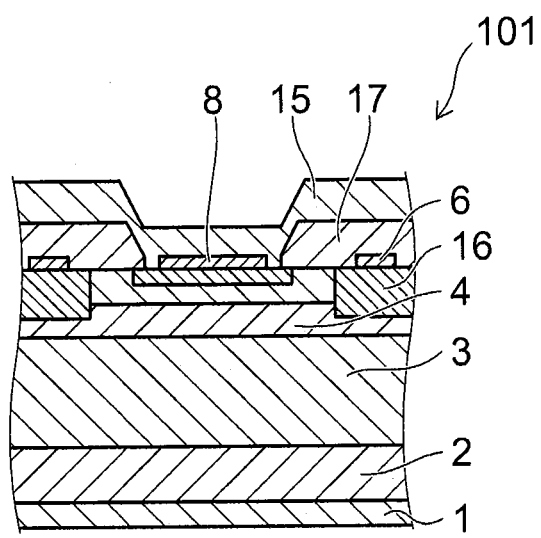

More specifically, FIGS. 11A and 12A are cross sectional views taken along the line A-A, and FIGS. 11B and 12B are cross sectional views taken along the line B-B.

Further, the manufacturing method is an example of a method of manufacturing a junction type field effect transistor having a breakdown voltage of 1.2 kV.

Figure 9A:
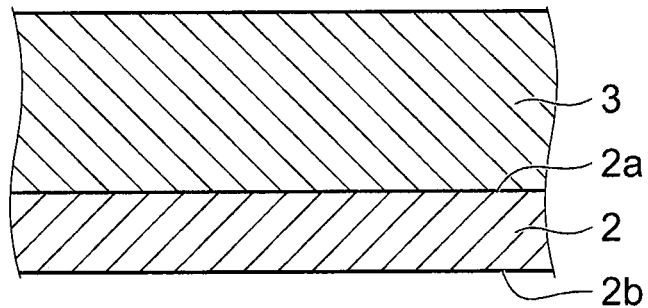
FIGS. 9 and 10 are cross sectional views illustrating a method of manufacturing a junction type field effect transistor.

As illustrated in FIG. 9A, the n-type SiC doped with donors of for example, $1\times10^{16}$ cm$^{-3}$ is epitaxially grown to a thickness of, for example, 12 μm on the first main surface 2a of the n-type SiC substrate doped with high concentration (n-type semiconductor substrate) 2 to form the n-type drift layer 3.

Figure 9B:
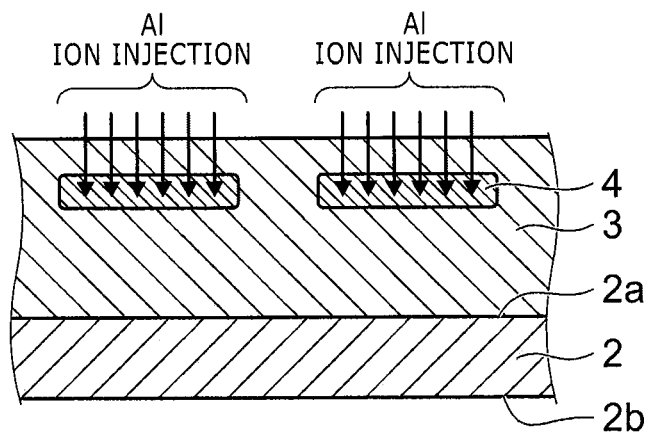

As illustrated in FIG. 9B, aluminum (Al) is optionally ion-implanted at an energy level of 350 keV into a region where the p-type gate region 4 is intended to be formed on the surface of the n-type drift layer 3.

Figure 9C:
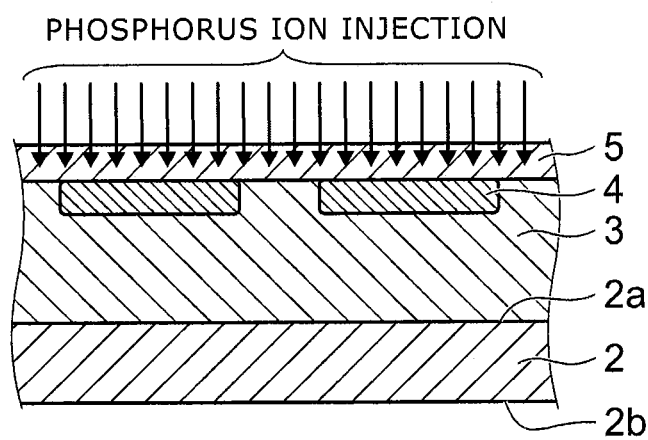

Further, as illustrated in FIG. 9C, phosphorus (P) is ion-implanted at energy levels of 40 keV, 90 keV, and 180 keV into the n-type drift layer 3, and donors are introduced into a region where the n-type channel layer 5 is intended to be formed.

Figure 10A:
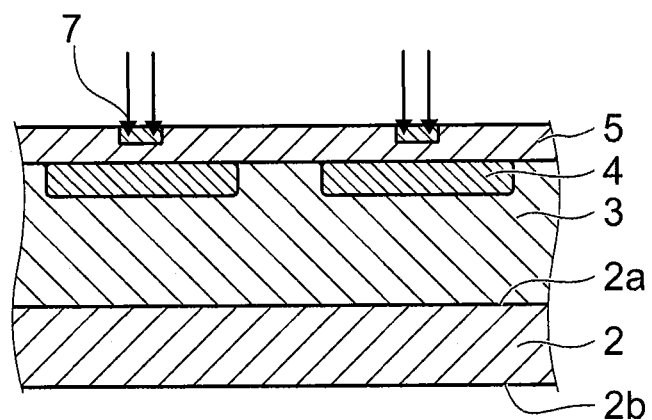

As illustrated in FIG. 10A, P is ion-implanted at an energy level of 40 keV into a region where the source region 7 is intended to be formed using a partially opened mask.

Figure 10B:
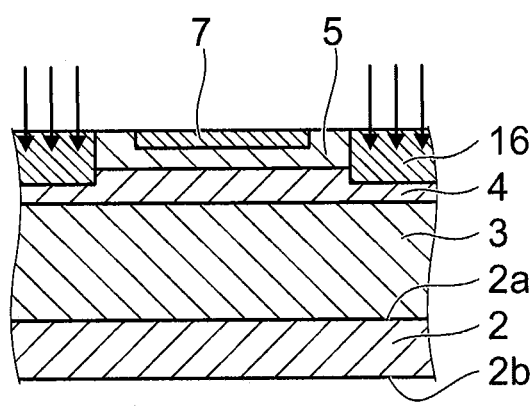

As illustrated in FIG. 10B, Al is ion-implanted at energy levels of 40 keV, 90 keV, and 180 keV into a region where the p-type base contact layer 16 is intended to be formed using a partially opened mask.

Although not illustrated, the n-type semiconductor substrate 2 is heat-treated at a temperature of 1700° C. to 2000° C., and implanted P and Al are activated to form an n-type region (the n-type channel layer 5 and the n-type source region 7) and a p-type region (the p-type gate region 4 and the p-type gate contact layer 16).

As illustrated in FIGS. 11A and 11B, nickel (Ni) electrodes are formed on the second main surface 2b of the n-type semiconductor substrate 2, the n-type source region 7, and the p-type base contact layer 16, each of which is heat-treated at a temperature of 900° C. to form the drain electrode 1, the source contact layer 8, and the gate electrode 6.

As illustrated in FIGS. 12A and 12B, the n-type channel layer 4, the gate electrode 6, the n-type source region 7, the source contact layer 8, and the p-type gate contact layer 16 are covered by stacking an SiO$_2$ film (insulating film) 17 having, for example, a thickness of 300 nm on a wafer surface. The regions covering the source contact layer 8 and the n-type source region 7 are opened to form the source electrode 15 including titanium (Ti) and aluminum (Al) over a portion of the n-type source region 7, the source contact layer 8, and the SiO$_2$ film 17 (the entire surface of the wafer) which are exposed in the opening. The source electrode 15 is in Schottky contact with the n-type channel layer 5. Further, the source electrode 15 is in ohmic contact with the n-type channel layer 5 through the n-type source region 7 and the source contact layer 8.

For example, the junction field effect transistor 101 manufactured using the method has a depth-direction profile of the impurity concentration illustrated in FIG. 4.

As illustrated in FIGS. 4 and 5, the threshold voltage of the junction type field effect transistor sensitively depends on the doping concentrations of the n-type channel layer 5 and the p-type gate region 4.

In the manufacturing method, the impurity concentration of the p-type gate region 4 and the impurity concentration and thickness of the n-type channel layer 5 are determined during an ion implantation process, thereby enabling control with high precision.

Further, diffusion coefficients of Al and P in SiC are extremely small, and distribution of impurities doped through ion implantation is not substantially changed even during heat treatment. Thus, a process control level which is required for threshold control may be satisfied.

In addition, in the manufacturing method, the doping concentration of the n-type drift layer 3 which is less than that of the n-type channel layer 5 is determined by epitaxial growth. Accordingly, as illustrated in FIGS. 4 and 5, variation in the doping concentration of the epitaxial growth fall within a range of ±0.25% with respect to the doping concentration of the n-type channel layer 5 even when the current epitaxial growth technique level allows an error of, for example, appropriately ±5%. Accordingly, degradation in controllability of the threshold voltage due to the variation in the doping concentration of the n-type drift layer 3 falls within the permissible range. Like this, the manufacturing method has good controllability of the threshold voltage, thereby securing a high yield rate of superior goods.

Hereinafter, a second embodiment will be described.

Figure 13:
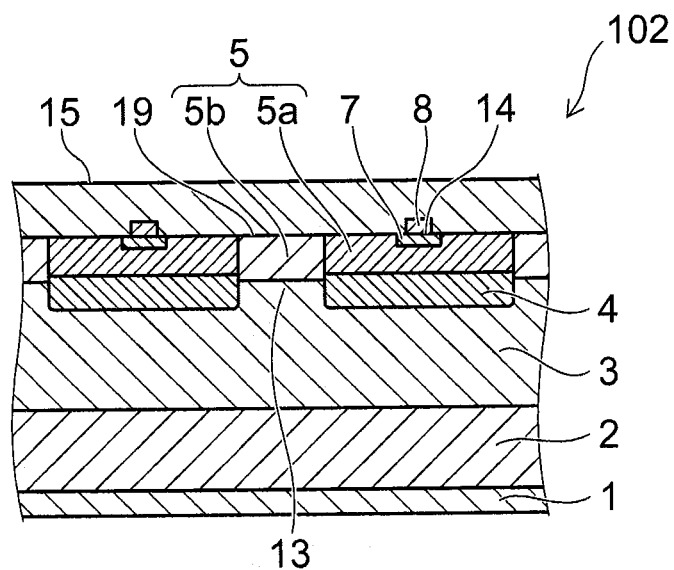
FIG. 13 is a cross sectional view illustrating a junction type field effect transistor of a second embodiment.

FIG. 13 is a cross sectional view illustrating a junction type field effect transistor of the second embodiment.

As illustrated in FIG. 13, the second embodiment is different from the first embodiment with respect to the configuration of the n-type channel layer. That is, a junction type field effect transistor 102 includes the n-type channel layer 5 having a first channel layer 5a and a second channel layer 5b.

The first channel layer 5a is provided on the p-type gate region 4 in the n-type channel layer 5. The second channel layer 5b is provided on the n-type drift layer 3 in the n-type channel layer 5 and is in contact with the Schottky contact portion 19 where a reverse electric field is applied.

Like this, the n-type channel layer 5 may not be necessarily formed with a uniform impurity concentration. Thus, for example, the n-type channel layer 5 may be doped according to a doping pattern of the p-type gate region 4.

In the embodiment, the doping concentration of the second channel layer 5b in contact with the Schottky contact portion 19 where the reverse electric field is applied may be set independently of the doping concentration of the first channel layer 5a. For example, the doping concentration of the second channel layer 5b may be set lower than the doping concentration of the first channel layer 5a. Thus, it is possible to obtain the effect in that a reverse leakage current of the Schottky contact may be reduced in addition to the effect of the first embodiment.

Hereinafter, a third embodiment will be described.

Figure 14:
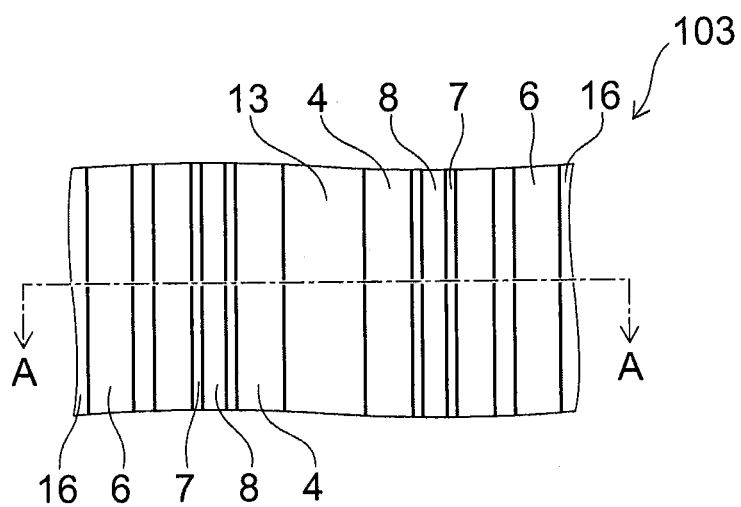
FIG. 14 is a plan view illustrating a junction type field effect transistor of a third embodiment.

FIG. 14 is a plan view illustrating a junction type field effect transistor of the third embodiment.

Figure 15:
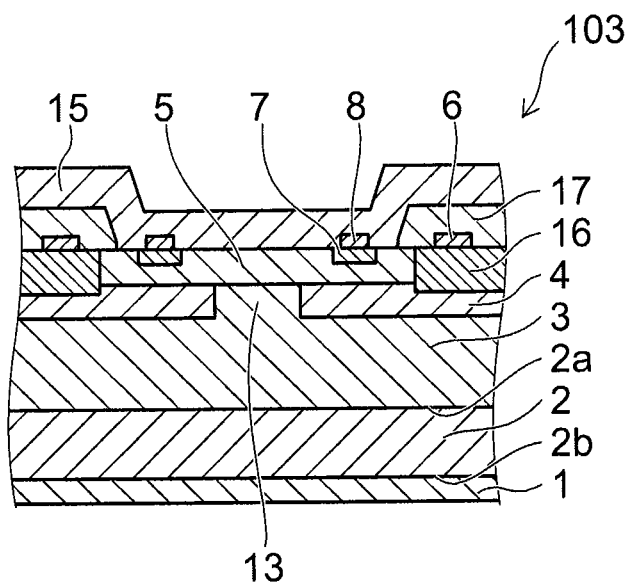
FIG. 15 is a cross sectional view illustrating the junction type field effect transistor of the third embodiment.

FIG. 15 is a cross sectional view illustrating the junction type field effect transistor of the third embodiment.

As illustrated in FIGS. 14 and 15, the third embodiment is different from the first embodiment with respect to the configurations of the p-type gate electrode 6 and the p-type gate contact layer 16. That is, a junction type field effect transistor 103 has the p-type gate region 6 and the p-type gate contact layer 16 which is extended in the first direction where the p-type gate region 4 is extended.

In the embodiment, a resistance extracted from the p-type gate region 4 to the gate electrode 6 is reduced, thereby increasing the speed of the switching operations in addition to the effect of the first embodiment.

Hereinafter, a fourth embodiment will be described.

Figure 16:
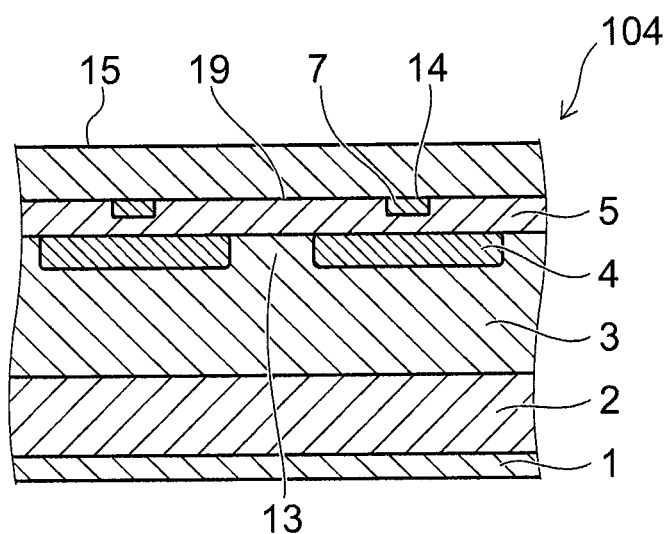
FIG. 16 is a cross sectional view illustrating a junction type field effect transistor of a fourth embodiment.

FIG. 16 is a cross sectional view illustrating a junction type field effect transistor of the fourth embodiment.

As illustrated in FIG. 16, the fourth embodiment is different from the first embodiment in that the source contact layer 8 is omitted. That is, a junction type field effect transistor 104 has the source electrode 15 which is provided over the n-type channel layer 5 and the n-type source region 7.

For example, the source electrode 15 may be a stacked film including Ti and Al. The source electrode 15 is in ohmic contact with the n-type source region 7 in the ohmic contact portion 14 and in Schottky contact with the n-type drift layer 3 in the Schottky contact portion 19.

In the embodiment, there is no source contact layer 8, and thus it is possible to form the source electrode 15 using the same electrode material during one process. Thus, allowance margin of an ohmic electrode to the n-type source region 7 may be deleted, thereby easily miniaturizing the source electrode 15 in addition to the effect of the first embodiment.

Hereinafter, a fifth embodiment will be described.

Figure 17:
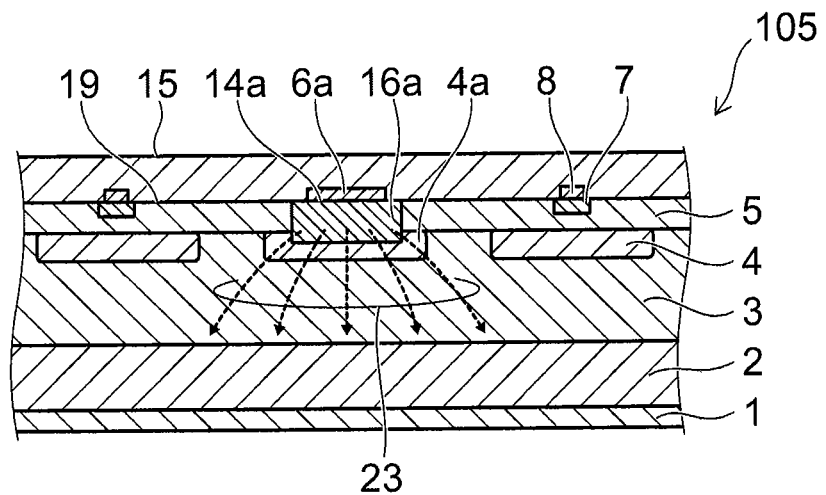
FIG. 17 is a cross sectional view illustrating a junction type field effect transistor of a fifth embodiment.

FIG. 17 is a cross sectional view illustrating a junction type field effect transistor of the fifth embodiment.

As illustrated in FIG. 17, the fifth embodiment is different from the first embodiment in that a p-type base region 4a, a p-type base contact layer 16a, and an ohmic electrode 6a are further provided, and the source electrode 15 is in ohmic contact with the p-type base region 4a through an ohmic electrode 6a. That is, in the junction type field effect transistor 105, the source electrode 15 is in ohmic contact with the n-type source region 7 in the ohmic contact portion 14, in Schottky contact with the n-type drift layer 3 in the Schottky contact portion 19 (not illustrated), and in ohmic contact with the p-type base contact layer 16a in the ohmic contact portion 14a. The p-type base region 4a and the n-type drift layer 3 form a p-n junction.

Like this, in the embodiment, a p-n junction diode including the p-type base region 4a and the n-type drift layer 3 is provided in parallel with a Schottky diode including the source electrode 15 and the n-type channel layer 5.

Further, even in the embodiment, the Schottky diode including the source electrode 15 and the n-type drift layer 3 performs a reverse conducting operation. However, the Schottky diode is a unipolar device, and thus conductivity modulation does not occur in the n-type drift layer 3 and an upper limit of operation current density is relatively low. Thus, when a reverse high current surge is applied, the device may be damaged because all the current may not flow therethrough.

In the embodiment, when a high current surge is input, and an electric potential drop in the Schottky diode becomes greater than a diffusion potential of a p-n diode including the p-type base region 4a and the n-type drift layer 3, holes 23 are injected to the n-type drift layer 3 from the p-type base region 4a which is connected to the source electrode 15 and the conductivity modulation occurs in the n-type drift layer 3. Thus, a conducting ability may be significantly improved in the high current density region, thereby securing a current surge capacity in a reverse conducting direction. Further, the surge current occurs in a short time to limit an increase in defects due to recombination of minority carriers and does not affect the operating life of the device.

In the first to fourth embodiments, holes generated in the n-type drift layer 3 flow into the p-type gate region 4 when an avalanche breakdown occurs. When the gate electric potential increases and thus the channel is opened to be in an "on" state, the electron current 22 flows from the source electrode 15 to the drain electrode 1. A high avalanche capacity may be secured with this mechanism. However, a current for maintaining the gate potential in an "on" state flows from the junction type field effect transistor back to a gate circuit which is connected to the gate electrode. Thus, the transistors of the first to fourth embodiments each include a gate driving circuit which is required to have a certain current absorption capability. According to the type of the driving circuit, the current absorption capability may not be sufficient to destroy the driving circuit when the junction type field effect transistor enters the avalanche state.

In the embodiment, the avalanche breakdown may be set to occur in the p-n diode between the source and the drain to prevent the avalanche current from flowing to the gate circuit. Accordingly, the gate driving circuit may be protected, in addition to the effect of the first embodiment.

Further, the p-type base region 4a and the p-type base contact layer 16a may be formed in a form of an isolated island form, using the same process as the p-type gate region 4 and the p-type gate contact layer 16. The junction type field effect transistor according to the embodiment may be manufactured in the same manners as in the junction type field effect transistor according to the first embodiment, except for that the p-type base contact layer 16a is in ohmic contact with the source electrode 15.

Figure 18:
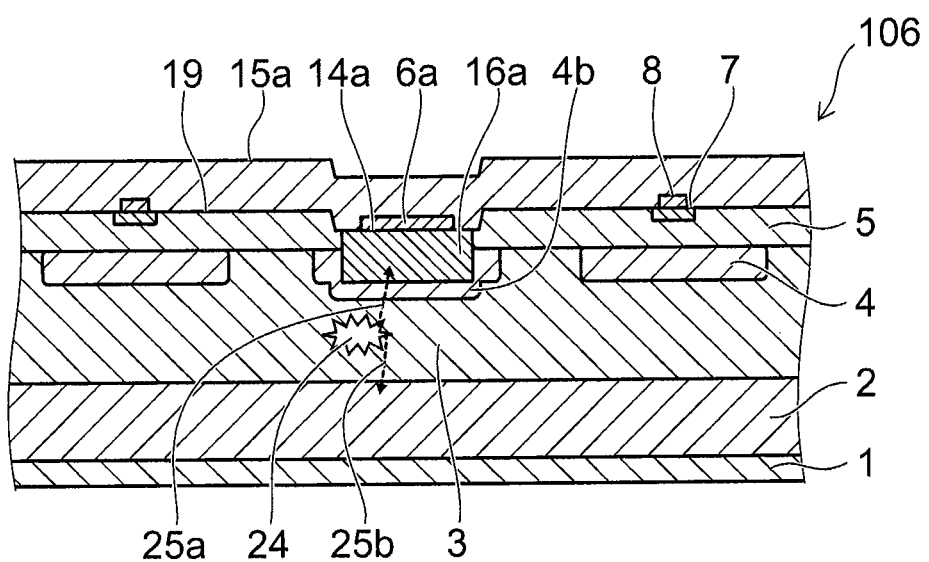
FIG. 18 is another cross sectional view illustrating the junction type field effect transistor of the fifth embodiment.

FIG. 18 is another cross sectional view illustrating the junction type field effect transistor of the fifth embodiment.

As illustrated in FIG. 18, a junction type field effect transistor 106 is different from the junction type field effect transistor 105 with respect to the configuration of the p-n diode which is provided between the source electrode 15a and the drain electrode 1. That is, in the junction type field effect transistor 106, the p-type base region 4b is provided in a concave shape to be partially recessed, and the ohmic electrode 6a is provided in the recessed portion through the p-type base contact layer 16a. Then, the ohmic electrode 6a is covered to provide the source electrode 15a.

In the embodiment, since the p-type base region 4b is recessed in a concave shape, a thickness of the n-type drift layer 3 between the p-type base region 4b and the n-type semiconductor substrate 2 may be reduced and thus the avalanche breakdown voltage may be decreased. Accordingly, it is possible that the avalanche breakdown 24 occurs in the p-n diode prior to the Schottky diode. The hole current 25a generated in the avalanche breakdown flows into the source electrode 15a via the p-type base region 4a and fails to flow into a gate side.

Accordingly, in the embodiment, it is possible to prevent the avalanche current from flowing into the gate circuit and to protect the gate driving circuit in addition to the effect of the first embodiment.

Further, a process of recessing the p-type base region 4b may be commonly performed with, for example, the process of forming an alignment mark for a lithographic process on a surface of SiC. Thus, the transistor of the embodiment may be manufactured using the same process as the first embodiment.

In the embodiments described above, the p-type gate region 4 which is buried in the n-type drift layer 3 is used as the gate. However, for example, the p-type SiC has large acceptor ionization energy and very high resistivity. Thus, it may be possible to increase the gate resistance.

Accordingly, by providing the p-type gate contact layer 16 at an appropriate distance, it is also possible to adopt a configuration of reducing the gate resistance of the buried p-type gate region 4 and simultaneously extending the gate electrode 6, which is provided on the p-type gate contact region 16 to a gate pad (not illustrated) and reducing the gate resistance.

Further, although description of junction termination has been omitted, a junction termination voltage may be secured appropriately adopting a junction termination extension structure (JTE structure) and a guard ring structure. In such a case, the gap portion 13 in the n-type drift layer 3 is provided between the p-type gate region 4 and a termination portion.

In the above embodiments, although first conductive type and the second conductive type are described as n-type and p-type, respectively, the first conductive type may be p-type and the second conductive type may be n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A junction type field effect transistor comprising:
a first conductive type semiconductor substrate;
a first conductive type drift layer provided on a first main surface of the first conductive type semiconductor substrate;
a second conductive type gate region provided on a surface of the first conductive type drift layer;
a first conductive type channel layer provided on the first conductive type drift layer and the second conductive type gate region;
a first conductive type source region provided on a surface of the first conductive type channel layer to face the second conductive type gate region, the first conductive type source region having an impurity concentration higher than an impurity concentration of the first conductive type channel layer;
a source electrode provided on the first conductive type channel layer and the first conductive type source region, the source electrode being in Schottky contact with the first conductive type channel layer and in ohmic contact with the first conductive type source region;
a drain electrode provided on a second main surface on an opposite side of the first main surface of the first conductive type semiconductor substrate;
a second conductive type gate contact layer provided on the surface of the first conductive type channel layer to reach the second conductive type gate region, the second conductive type gate contact layer having an impurity concentration higher than the second conductive type gate region; and
a gate electrode provided on the gate contact layer,
an impurity concentration of the first conductive type channel layer being higher than an impurity concentration of the first conductive type drift layer.

2. The transistor according to claim 1, wherein
the first conductive type source region is extended in a first direction perpendicular to a line normal to the first main surface and includes a plurality of strip-shaped regions arranged along a second direction perpendicular to the first direction and the line normal to the first main surface, and
the second conductive type gate contact layer is extended in the second direction.

3. The transistor according to claim 1, wherein
the first conductive type source region is extended in a first direction perpendicular to a line normal to the first main surface and includes a plurality of strip-shaped regions arranged along a second direction perpendicular to the first direction and the line normal to the first main surface, and
the second conductive type gate contact layer is extended in the first direction.

4. The transistor according to claim 1, wherein
the first conductive type channel layer includes:
a first channel layer provided on the first conductive type drift layer; and
a second channel layer provided on the second conductive type gate region, the second channel layer having an impurity concentration different from the first channel layer.

5. The transistor according to claim 1, wherein the first conductive type channel layer is depleted when a voltage between the gate electrode and the source electrode is less than or equal to the threshold voltage.

6. The transistor according to claim 1, wherein the second conductive type gate region has an impurity concentration higher than the impurity concentration of the first conductive type drift layer.

7. The transistor according to claim 1, wherein the source electrode includes a source contact layer provided on the first conductive type source region.

8. The transistor according to claim 1, further comprising:
a second conductive type base region provided on a surface of the drift layer, the source electrode being in ohmic contact with the second conductive type base region.

9. The transistor according to claim 8, wherein a surface of the second conductive type base region is partially provided in a concave shape.

10. The transistor according to claim 8, further comprising:
a second conductive type base contact layer provided between the source electrode and the second conductive type base region.

11. The transistor according to claim 1, wherein the first conductive type semiconductor substrate includes silicon carbide.

12. The transistor according to claim 1, wherein the source electrode is a stacked film including titanium (Ti) and aluminum (Al).

13. The transistor according to claim 1, wherein
the impurity concentration of the first conductive type channel layer is more than 10 times higher than the impurity concentration of the first conductive type drift layer.

14. A junction type field effect transistor comprising:
a first conductive type semiconductor substrate;
a first conductive type drift layer provided on a first main surface of the first conductive type semiconductor substrate;
a second conductive type gate region provided on a surface of the first conductive type drift layer;
a first conductive type channel layer provided on the first conductive type drift layer and the second conductive type gate region;
a first conductive type source region provided on a surface of the first conductive type channel layer to face the second conductive type gate region, the first conductive type source region having an impurity concentration higher than the first conductive type channel layer;
a source electrode provided on the first conductive type channel layer and the first conductive type source region, the source electrode being in Schottky contact with the first conductive type channel layer and in ohmic contact with the first conductive type source region;
a drain electrode provided on a second main surface on an opposite side of the first main surface of the first conductive type semiconductor substrate;
a second conductive type gate contact layer provided on the surface of the first conductive type channel layer to reach the second conductive type gate region, the second conductive type gate contact layer having an impurity concentration higher than the second conductive type gate region; and
a gate electrode provided on the gate contact layer,
wherein
the first conductive type source region is extended in a first direction perpendicular to a line normal to the first main surface and includes a plurality of strip-shaped regions arranged along a second direction perpendicular to the first direction and the line normal to the first main surface, and the second conductive type gate contact layer is extended in the second direction.

15. A junction type field effect transistor comprising:
- a first conductive type semiconductor substrate;
- a first conductive type drift layer provided on a first main surface of the first conductive type semiconductor substrate;
- a second conductive type gate region provided on a surface of the first conductive type drift layer;
- a first conductive type channel layer provided on the first conductive type drift layer and the second conductive type gate region;
- a first conductive type source region provided on a surface of the first conductive type channel layer to face the second conductive type gate region, the first conductive type source region having an impurity concentration higher than the first conductive type channel layer;
- a source electrode provided on the first conductive type channel layer and the first conductive type source region, the source electrode being in Schottky contact with the first conductive type channel layer and in ohmic contact with the first conductive type source region;
- a drain electrode provided on a second main surface on an opposite side of the first main surface of the first conductive type semiconductor substrate;
- a second conductive type gate contact layer provided on the surface of the first conductive type channel layer to reach the second conductive type gate region, the second conductive type gate contact layer having an impurity concentration higher than the second conductive type gate region; and
- a gate electrode provided on the gate contact layer, wherein
- the first conductive type source region is extended in a first direction perpendicular to a line normal to the first main surface and includes a plurality of strip-shaped regions arranged along a second direction perpendicular to the first direction and the line normal to the first main surface, and
- the second conductive type gate contact layer is extended in the first direction.

* * * * *